United States Patent [19]

Takada

[11] Patent Number: 5,014,243

[45] Date of Patent: May 7, 1991

[54] PROGRAMMABLE READ ONLY MEMORY (PROM) HAVING CIRCULAR SHAPED EMITTER REGIONS

[75] Inventor: Naruaki Takada, Tokyo, Japan

[73] Assignee: NEC Corporation, Tokyo, Japan

[21] Appl. No.: 276,913

[22] Filed: Nov. 28, 1988

[30] Foreign Application Priority Data

Nov. 26, 1987 [JP] Japan .................................. 62-299110

[51] Int. Cl.⁵ ......................... G11C 17/14; H01L 29/06
[52] U.S. Cl. ..................................... 365/96; 365/104; 365/225.6; 357/20; 357/68
[58] Field of Search .................... 365/174, 96, 104, 51, 365/94, 225.6; 357/13, 20, 34, 68

[56] References Cited

U.S. PATENT DOCUMENTS

| | | | |
|---|---|---|---|
| 4,109,169 | 8/1978 | Tantraporn et al. ................. | 357/13 |
| 4,417,265 | 11/1983 | Murkland .............................. | 357/68 |
| 4,659,979 | 4/1987 | Burnham et al. ..................... | 357/20 |
| 4,792,833 | 12/1988 | Fukushima ........................... | 365/104 |
| 4,835,590 | 5/1989 | Ueno et al. ............................ | 365/96 |

Primary Examiner—Glenn Gossage
Attorney, Agent, or Firm—Helfgott & Karas

[57] ABSTRACT

A semiconductor memory of a junction destruction type includes programmable read-only memory (PROM) elements arranged in the form of a matrix on a substrate, bit lines connected to emitter regions of the PROM elements, and word lines connected to collector regions of the PROM elements, wherein the emitter regions of the PROM elements have a circular shape. Emitter regions have an opposite type of conductivity to that of the substrate. The bit lines are commonly connected to the emitter regions formed in the collector regions, respectively, to thereby increase density of the memory device.

8 Claims, 4 Drawing Sheets

PROGRAMMABLE READ ONLY MEMORY (PROM) HAVING CIRCULAR SHAPED EMITTER REGIONS

BACKGROUND OF THE INVENTION

1. Field of the Invention

The present invention relates to a programmable read-only memory, and particularly to a semiconductor memory cell of junction destruction-type PROM.

2. Description of the Related Art

In a PROM, arbitrary data to be stored are written in the memory and, the written content is fixed to the memory cells without being erased even when the power source to the memory circuit is interrupted. The larger is the memory capacity of the memory circuit, on the other hand, the more of the desired data can be stored. It has, therefore, been desired to highly densely integrate the memory elements in a small area of a semiconductor chip in order to increase the capacity.

In a memory circuit employing general junction destruction-type PROM cells, an overcurrent (write current) is permitted to flow into two pn junctions connected between a bit line and a word line so that one pn junction that is reversed-biased is destroyed and only the pn junction which is forward biased is left to hold the data.

The write current used in the memory circuit has a current value and a voltage value that are large enough to destroy the pn junctions which are reverse biased.

The impurity regions forming such pn junctions have heretofore had a square shape; i.e., the impurity regions have increased circumferential lengths and required a large write current. Therefore, the voltage and current supplied to a predetermined memory cell at the time of writing the data affect other surrounding memory cells or peripheral circuits. For instance, in the case of a junction destruction-type PROM memory cell in which a metal wiring is directly connected to the impurity region, the wiring metal connected to the memory cell partly infiltrates into the destroyed portion due to junction destruction at the time of writing the data. The depth of infiltration increases with the increase in the write current and reaches near the pn junction that is not destroyed to deteriorate the pn junction.

Furthermore, since a high voltage is applied at the time of writing the data, the write current may leak into other memory cells or into the peripheral circuits when the voltage applied is greater than a breakdown voltage of the memory cells, greater than a dielectric breakdown voltage required for the field oxide regions surrounding the memory cells, greater than a breakdown voltage required for the pn junction among the adjacent memory cells, or greater than a breakdown voltage required between the memory cells and the substrate. In order to prevent such leakage of write current or to decrease the effects of write current, therefore, field oxide regions must be formed having a sufficiently high dielectric breakdown voltage as well as sufficiently large depth and width, making it necessary to maintain large margin among the elements and increased thickness of the semiconductor layer in which the memory cells are to be formed.

As described above, various limitations are imposed on the memory circuit employing the junction destruction-type PROM memory cell hindering the memory circuit from being highly densely integrated.

SUMMARY OF THE INVENTION

The object of the present invention is to provide a semiconductor memory of a junction destruction-type which requires a reduced write current and, hence, enables the memory circuit to be highly densely integrated.

According to the present invention, there is provided a semiconductor memory which comprises a plurality of collector regions formed in one main surface of a semiconductor substrate having one type of conductivity, said plurality of collector regions having the other type of conductivity, a plurality of base regions having the one type of conductivity arranged in line in each of said collector regions, emitter regions having the other type of conductivity with substantially a circular shape and being provided in each of said base regions, word lines connected to each of said collector regions, and bit lines which are commonly connected to said emitter regions which are formed in different collector regions.

Being constituted as described above, either one of the two pn junctions formed between the emitter and the base and between the base and the collector is destroyed by the write current in order to write data. Here, since the emitter region has a circular shape, the circumferential length of the emitter region is shorter than that of the square emitter regions according to the prior art and the data can be written with a smaller write current than that of the prior art.

As described above, the semiconductor memory of the present invention makes it possible to decrease the write current of the PROM, to decrease the breakdown voltage required for the memory cells and the peripheral circuits, to decrease the margin between the elements, to decrease the thickness of the semiconductor layer, and to increase the degree of integration. Namely, the present invention solves many problems involved in the conventional PROM's and provides a memory device that is highly densely integrated.

BRIEF DESCRIPTION OF THE DRAWINGS

The aforementioned objects, constitution and advantages of the present invention will become more apparent from the following detailed description taken in conjunction with the accompanying drawings wherein.

DESCRIPTION OF THE PRIOR ART

Figure 1:
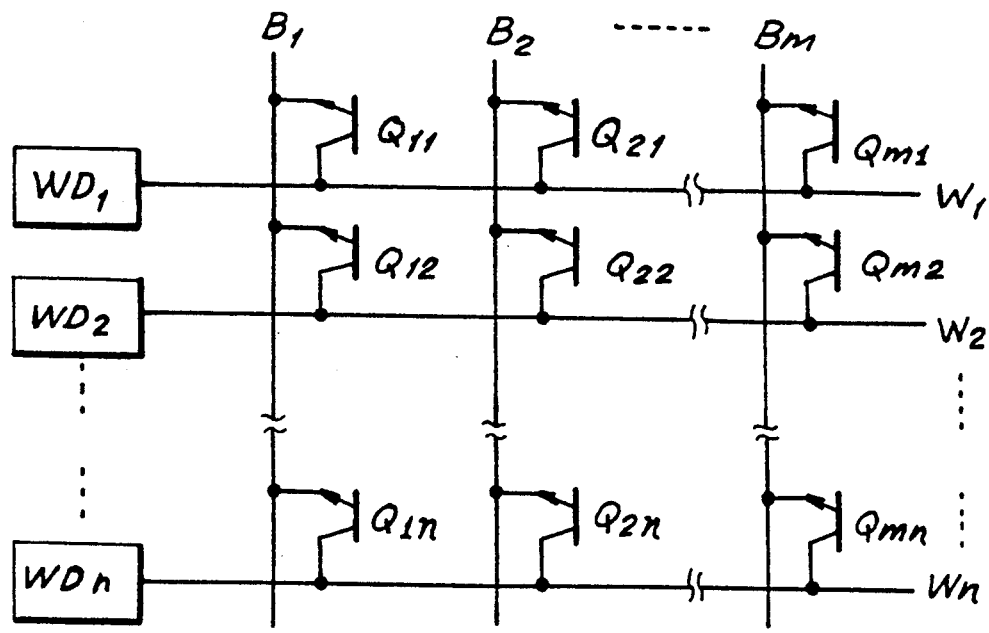
FIG. 1 is a circuit diagram illustrating major portions of a conventional memory device employing junction destruction-type PROM cells.

FIG. 1 illustrates major portions of a conventional memory device employing the junction destruction-type PROM cells. In this case, an npn bipolar transistor is used as a memory cell. Memory cells $Q_{11}$ to $Q_{mn}$ are provided at the intersecting points of the bit lines $B_1$, $B_2$, - - - , $B_m$ and the word lines $W_1$, $W_2$, - - - , $W_n$, the emitters of the memory cells being connected to the bit lines and their collectors being connected to the word lines. The word lines $W_1$, $W_2$, - - - , $W_n$ are connected to the word drivers $WD_1$, $WD_2$, - - - , $WD_n$, respectively. The word drivers select bits in which write current is supplied from the bit lines, and receive the write current. That is, when, for example, the data is to be written onto a memory cell $Q_{22}$, a bit line $B_2$ and a word line $W_2$ are selected, and the write current is supplied from the bit line $B_2$ to destroy the emitter-base junction of the memory cell $Q_{22}$ and is absorbed by the word driver $WD_2$.

Figure 2:
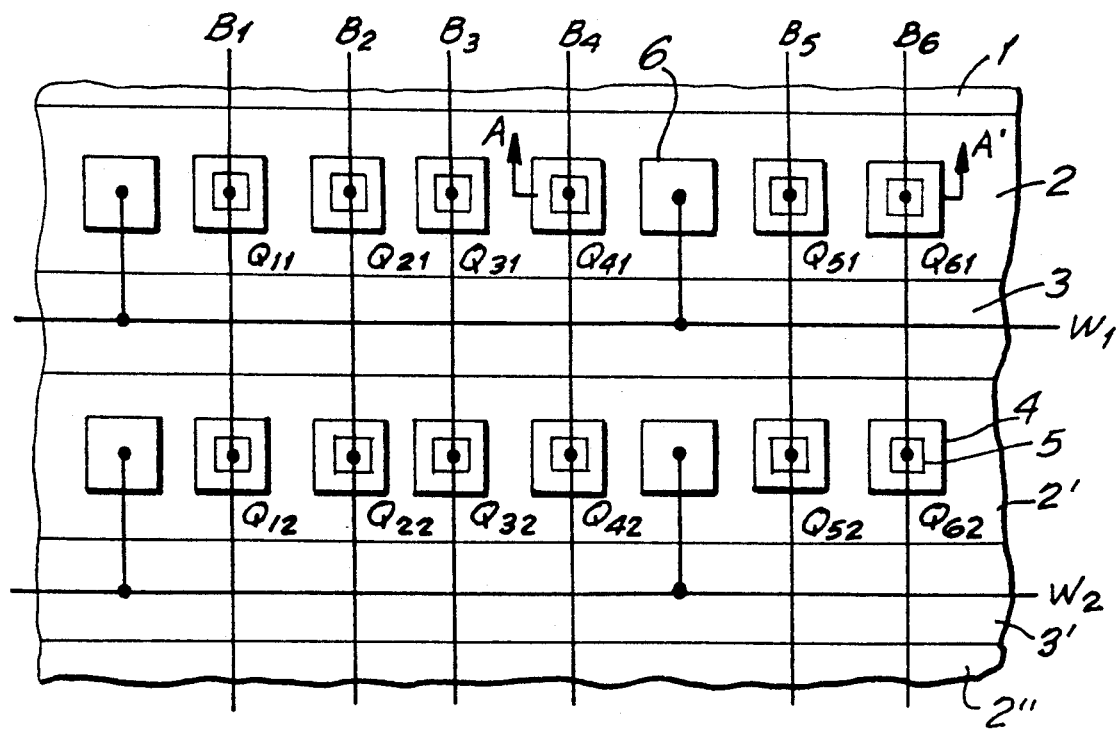
FIG. 2 is a schematic plan view illustrating major portions of a conventional memory device employing junction destruction-type PROM cells.

FIG. 2 is a schematic plan view of the memory device of FIG. 1. Belt-shaped collector regions 2, 2', 2", - - - $2^n$ are formed in a semiconductor substrate 1, and isolation regions 3, 3', - - - . . . $3^n$ are provided between these belt-like collector regions, such that the belt-like collector regions 2, 2', 2", - - - $2^n$ are electrically isolated from each other. In each of the collector regions 2, 2', 2", - - - . . . $2^n$ are provided a plurality of base regions 4 which contain each an emitter region 5. Thus, the memory cells $Q_{11}$ to $Q_{mn}$ are formed in the semiconductor substrate 1. The emitter regions 5 of memory cells $Q_{11}$ to $Q_{mn}$ are connected to the bit lines $B_1$, $B_2$, - - - , $B_m$ and the collector regions 2, 2', 2", - - - . . . $2^n$ are connected to the word lines $W_1$, $W_2$, - - - , $W_n$ via collector electrodes 6.

Figure 3:
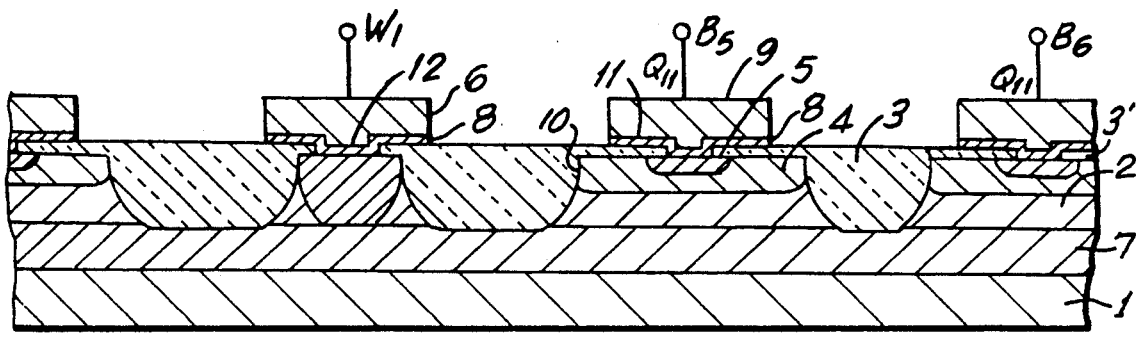
FIG. 3 is a section view of the memory device along the line A–A' of FIG. 2.

FIG. 3 is a section view of the junction destruction-type PROM cell, taken along the line A-A' of FIG. 2. The structure will now be described in detail. A plurality of n-type buried layers 7 are formed in the p-type silicon substrate 1, and an n-type epitaxial layer 2 is deposited thereon. An oxide film 3' provided on the n-type epitaxial layer 2 is selectively oxidized on the n-type buried layers 7 and on the regions in which each memory cell is formed so as to form isolation regions 3 in order to form a plurality of collector regions composed of the n-type epitaxial layer 2. The p-type base region 4 and the n-type emitter region 5 having square shapes are successively provided in the epitaxial layer 2. A polycrystalline silicon film 8 doped with impurities is formed on the oxide film 3' having a square opening (emitter opening), and the emitter region 5 is formed by thermal diffusion in the base region 4 through the opening. Thus, the two pn junctions 10 and 11 are formed between the base and the collector, and between the emitter and the base. The emitter region 5 is connected, via the polycrystalline silicon film 8, to an emitter electrode 9 connected to the bit line $B_5$. The collector region 2 is connected via an n-type contact region 12 and the polycrystalline silicon film 8 to the collector electrode 6 which in turn, is connected to the word line $W_1$. With the above-mentioned construction, when the data is to be written into the memory cell, the write current is supplied from the bit line $B_5$; i.e., the current flows in the reverse biasing direction into the pn junction 11 between the n-type emitter region 5 and the p-type base region 4, and whereby the junction is destroyed to write the data. The write current flows into the collector region 2 via the pn junction 10 and is received by the word driver $WD_1$ connected to the word line $W_1$.

Figure 4:
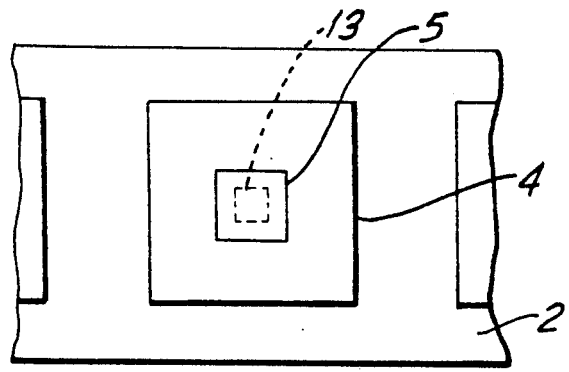
FIG. 4 is a pattern arrangement diagram of a conventional junction destruction-type PROM cells.

FIG. 4 is a plan view showing in detail the layout of the conventional junction destruction-type PROM cell that is shown in FIG. 2. The base region 4 is formed in the collector region 2, and impurities doped into the polycrystalline silicon film 8 are thermally diffused through the emitter opening 13 formed in the oxide film 3' to form the emitter region 5 in the base region 4. Thus, with the conventional junction destruction-type PROM cell, the emitter region 5 has a square shape or an elongated shape in plane as it is formed through the emitter opening 13 of a square shape or an elongated shape.

Figure 5:
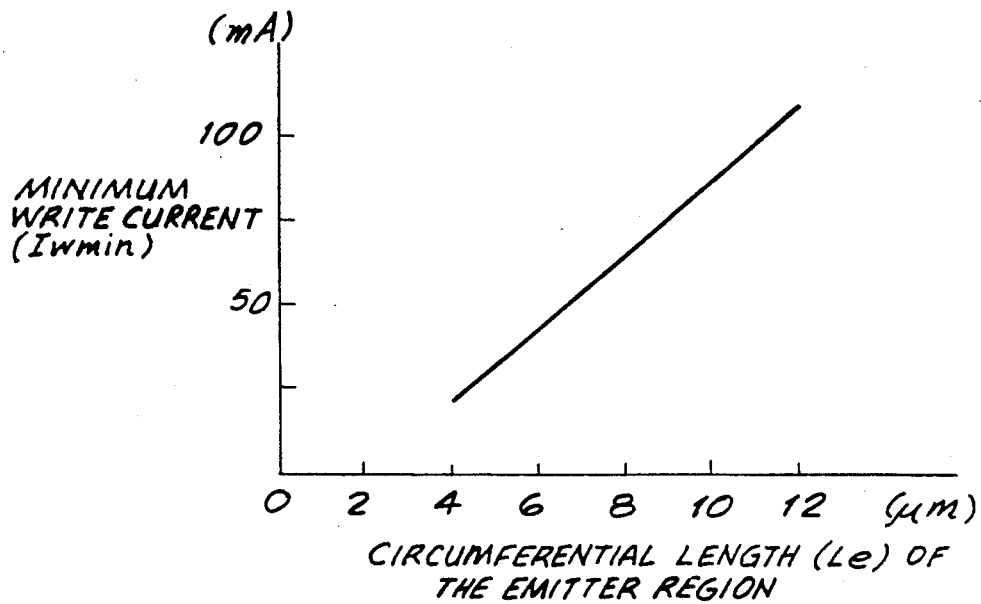
FIG. 5 is a diagram of characteristics comparing the circumferential length of the emitter region with a minimum write current.

FIG. 5 is a diagram of characteristics illustrating a relationship between the circumferential length of the emitter region and a minimum write current when the emitter region is formed with an impurity concentration of $1 \times 10^{20}/cm^3$ and a depth of 0.1 $\mu$m. As will be obvious from FIG. 5, the minimum write current (Iwmin) varies in proportion to the circumferential length (Le) of the emitter region. In this case, when the diffusion depth of the emitter region is D, the circumferential length of the emitter region is longer than the circumferential length of the emitter opening by about 8D, because the diffused region is widened from the emitter opening in the direction of latelal.

In the above-mentioned conventional junction destruction-type PROM in which the emitter opening has a square shape or an elongated shape, the emitter region has an increased circumferential length and requires an increased write current. Therefore, a large voltage is applied at the time of writing the data, and an increased breakdown voltage is required for the cell such that the write current will not be leaked. Therefore, it is not allowed to decrease the margin between the elements or to decrease the thickness of the epitaxial layer, making it difficult to accomplish high degree of integration.

DETAILED DESCRIPTION OF THE PREFERRED EMBODIMENT

The invention will now be described in conjunction with the drawings.

Figure 6:
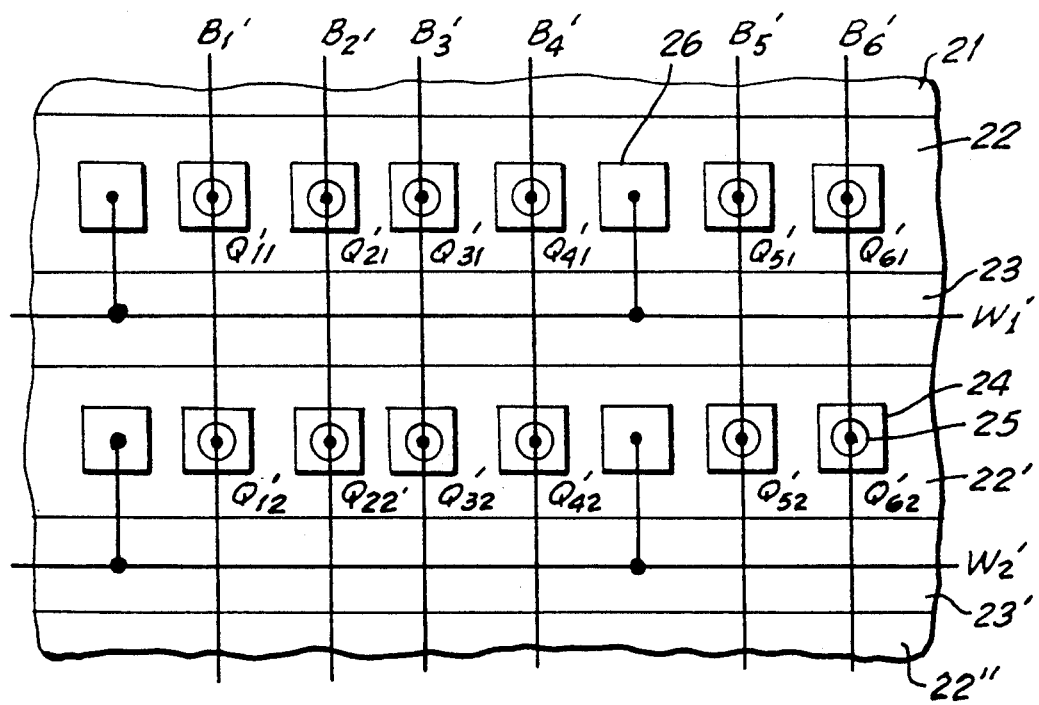
FIG. 6 is a schematic plan view illustrating major portions of a memory device employing the junction destruction-type PROM cells according to the present invention.

FIG. 6 is a schematic plan view which illustrates an embodiment of the present invention wherein the emitter regions have a circular shape. FIG. 6 illustrates the case where memory cells are formed on the p-type semiconductor substrate. On the p-type semiconductor substrate 21 are formed n-type semiconductor layers maintaining an impurity concentration of, for example, 3 to $4 \times 10^{19}/cm^3$ and a thickness of 1.0 to 3.0 $\mu$m that will serve as buried layers, and n-type epitaxial layers that will serve as collector regions 22, 22', 22", - - - are formed thereon with an impurity concentration of $5 \times 10^{15}/cm^3$ and a thickness of 1.5 to 2.0 $\mu$m. An oxide film formed on the n-type epitaxial layer is selectively oxidized to form field oxide layers 23, 23', - - - and isolation regions between the memory cells, and the collector regions 22, 22', 22", - - - are electrically isolated from each other and the leakage of current from the memory cells is prevented. A plurality of p-type base regions 24 are formed in each of the belt-like collector regions 22, 22', 22", - - - , each of the p-type base regions having an impurity concentration of 5 to $6 \times 10^{18}/cm^3$, a depth of 0.5 to 1.0 $\mu$m, and a side of a length of 5.0 to 10.0 $\mu$m. In each base region 24 is formed the n-type emitter region 25 having a circular shape in plane by diffusing impurities at a concentration of $1.0 \times 10^{20}/cm^3$ maintaining a depth of 0.1 to 0.3 μm through an opening of a diameter of 1.4 μm formed in the oxide film. In this case, the emitter region 25 has a diameter of 1.6 to 2 μm. The emitter regions 25 of the thus formed memory elements $Q_{11}'$ to $Q_{mn}'$ are connected to the bit lines $B_1'$, $B_2'$, - - -, $B_m'$, and the collector regions 22, 22', 22'', - - - are connected to the word lines $W_1'$, $W_2'$, - - - $W_n'$ via the collector regions 26.

The practical impurity concentrations in the collector, base and emitter regions formed in the present invention are $10^{15}$ to $10^{16}/cm^3$ in the collector region, $10^{18}$ to $10^{19}/cm^3$ in the base region, and $10^{19}$ to $10^{21}/cm^3$ in the emitter region.

Figure 7:
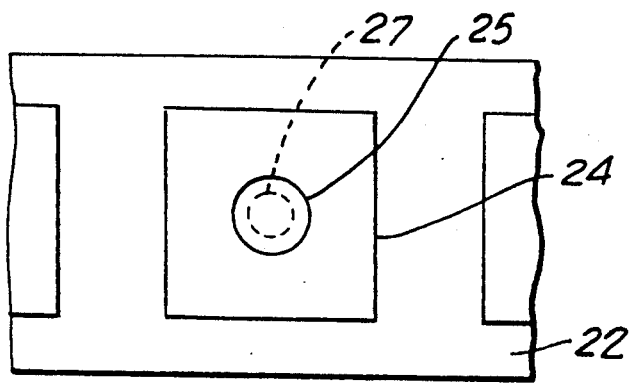
FIG. 7 is a pattern arrangement diagram of the junction destruction-type PROM cell according to the present invention.

FIG. 7 is a plan view showing in detail the layout of the junction destruction-type PROM cell according to the present invention. The p-type base region 24 is formed in the n-type collector region 22, and the n-type emitter region 25 is formed in the base region 24 through the emitter opening 27 of a circular shape formed in the oxide film. In the junction destruction-type PROM element of the present invention as described above, the emitter region 25 is formed through the circular emitter opening 27 and, hence, has a circular shape in plane. The shape in section is the same as that of FIG. 3, and is not described here.

Figure 8:
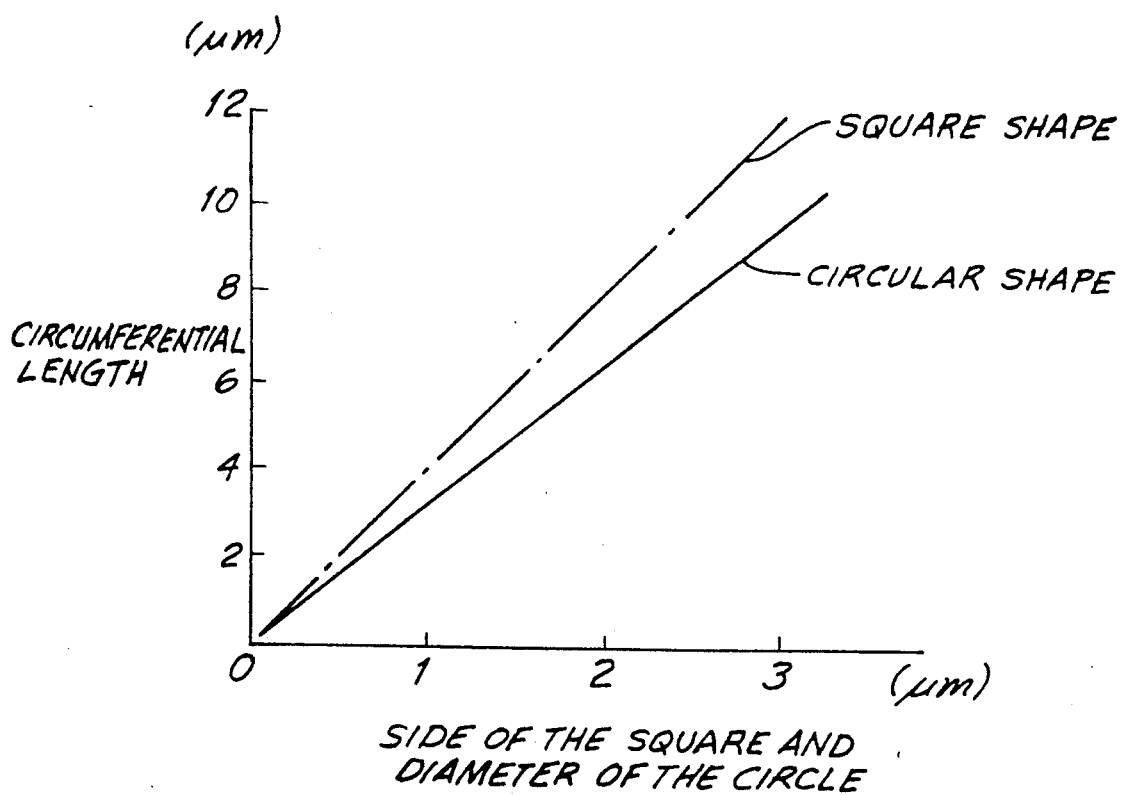
FIG. 8 is a diagram of characteristics comparing the circumferential lengths between the case of a square shape and the case of a circular shape.

FIG. 8 is a diagram of characteristics comparing the circumferential lengths of the case of a square shape and the case of a circular shape. The opening has a reduced area owing to the progress in the lithography technology. When the side of a square is equal to the diameter of a circle, a minimum limit of the opening is the same.

At present, the opening of as small as 1.3 μm can be formed.

It will be obvious from FIG. 8 that when the side of a square is equal to the diameter of a circle, the circumferential length becomes apparently shorter in the case of the circle than in the case of the square.

As is obvious from FIG. 5, therefore, the circumferential length can be more shortened when the emitter region has a circular shape than when the emitter region has a square shape, and the minimum write current can be reduced correspondingly. Therefore, the breakdown voltage required for the memory cells and the peripheral circuits can be decreased, margin can be decreased between the elements and the thickness of the epitaxial layer can be decreased. Therefore, the circuit can be highly densely integrated with ease.

As shown in Table 1, for example, when the emitter opening of a square shape has a side of 2 μm and the emitter region has a depth of 0.1 to 0.3 μm (emitter region has a side of 2.2 to 2.6 μm), a minimum write current of 80 mA is required whereas when the emitter opening of a circular shape has a diameter of 2 μm and the emitter region has a depth of 0.1 to 0.3 μm (emitter region has a diameter of 2.2 to 2.6 μm), a minimum write current of 60 mA is required, which is a reduction of 20 mA in the write current. Therefore, the required breakdown voltage can be decreased from 22 V to 18 V. With the required breakdown voltage being decreased as described above, the margin between the elements can be decreased from 12 μm to 9 μm.

TABLE 1

|  | Minimum write curent Iwmin | Breakdown voltage | Margin among the elements |
| --- | --- | --- | --- |
| Conventional example | 80 mA | 22 V | 12 μm |

TABLE 1-continued

|  | Minimum write curent Iwmin | Breakdown voltage | Margin among the elements |
| --- | --- | --- | --- |
| Present invention | 60 mA | 18 V | 9 μm |

Moreover, since the write current can be decreased, the wiring metal infiltrates little into the junction destruction portion when the data is written onto the junction destruction-type PROM cell in which the metal wiring is directly connected to the emitter region, and the other pn junction is prevented from being deteriorated.

Though the above embodiment has dealt with the case where the npn bipolar transistors are constituted on the p-type semiconductor substrate, it needs not be pointed out that the same effects are obtained even when the n-type semiconductor substrate is used provided the junction portions have a circular shape in plane.

What is claimed is:

1. A programmable read-only memory circuit of a junction destruction-type, comprising a plurality of collector regions formed in one main surface of a semiconductor substrate having one type of conductivity, said plurality of collector regions having an opposite type of conductivity to that of the substrate, a plurality of base regions having said one type of conductivity and being arranged in line in each of said collector regions, emitter regions having said opposite type of conductivity and being of a circular shape and being provided in each of said base regions, word lines respectively connected to each of said collector regions, and bit lines which are commonly connected to the emitter regions which are formed in said collector regions, respectively, whereby integration density of the memory circuit is highly increased.

2. A memory circuit according to claim 1, wherein said one type of conductivity is the p-type of conductivity and said opposite type of conductivity is the n-type of conductivity.

3. A programmable read-only memory circuit of a junction destruction-type, comprising a semiconductor substrate having one type of conductivity, buried layers having an opposite type of conductivity than, and provided on said semiconductor substrate, a first region having said opposite type of conductivity and formed on said buried layers, a second region having said one type of conductivity and formed on said first region, a third region having said opposite type of conductivity and having a circular shape and being provided in said second region, an insulating film formed on said third region and having an opening, and a wire electrically connected to said third region having the opposite type of conductivity via said opening.

4. A memory device according to claim 3, wherein said one type of conductivity is the p-type of conductivity and said opposite type of conductivity is the n-type of conductivity.

5. A memory device according to claim 3, wherein said one type of conductivity is the n-type of conductivity and said opposite type of conductivity is the p-type of conductivity.

6. A programmable read-only memory circuit of a junction destruction-type, comprising a first impurity region provided in a semiconductor layer having one type of conductivity, said first impurity region having a square shape and having an opposite type of conductivity than said semiconductor layer, a second impurity region of said one type of conductivity and provided in said first impurity region and having a circular shape, a first wiring electrically connected to said semiconductor layer, and a second wiring electrically connected to said second impurity region.

7. A memory device according to claim 6, wherein said one type of conductivity is the n-type of conductivity and said opposite type of conductivity is the p-type of conductivity.

8. A memory device according to claim 6, wherein said one type of conductivity is the p-type of conductivity and said opposite type of conductivity is the n-type of conductivity.

* * * * *